(12) United States Patent
Pschenitzka

(10) Patent No.: US 9,076,988 B2
(45) Date of Patent: Jul. 7, 2015

(54) OPTO-ELECTRICAL DEVICES INCORPORATING METAL NANOWIRES

(71) Applicant: Cambrios Technologies Corporation, Sunnyvale, CA (US)

(72) Inventor: Florian Pschenitzka, San Francisco, CA (US)

(73) Assignee: Cambrios Technologies Corporation, Sunnyvale, CA (US)

(*) Notice: Subject to any disclaimer, the term of this patent is extended or adjusted under 35 U.S.C. 154(b) by 0 days.

(21) Appl. No.: 14/109,164

(22) Filed: Dec. 17, 2013

(65) Prior Publication Data
US 2014/0175407 A1    Jun. 26, 2014

Related U.S. Application Data

(62) Division of application No. 13/651,128, filed on Oct. 12, 2012, now Pat. No. 8,637,859.

(60) Provisional application No. 61/546,938, filed on Oct. 13, 2011, provisional application No. 61/593,790, filed on Feb. 1, 2012.

(51) Int. Cl.
| | |
|---|---|
| *H01L 35/24* | (2006.01) |
| *H01L 51/52* | (2006.01) |
| *H01L 31/0232* | (2014.01) |
| *H01L 33/58* | (2010.01) |
| *H01L 51/50* | (2006.01) |
| *H01B 1/22* | (2006.01) |
| *H01L 51/44* | (2006.01) |
| *H05B 33/28* | (2006.01) |

(52) U.S. Cl.
CPC ........ *H01L 51/5262* (2013.01); *H01L 31/0232* (2013.01); *H01L 33/58* (2013.01); *H01L 51/50* (2013.01); *H01B 1/22* (2013.01); *H01L 51/442* (2013.01); *H01L 51/5234* (2013.01); *H01L 51/5268* (2013.01); *H01L 51/5275* (2013.01); *Y02E 10/549* (2013.01); *H05B 33/28* (2013.01); *H01L 2251/5369* (2013.01); *H01L 51/44* (2013.01)

(58) Field of Classification Search
CPC .................................................... H01L 51/5262
USPC ............................................. 257/40, E51.001
See application file for complete search history.

(56) References Cited

U.S. PATENT DOCUMENTS

| | | |
|---|---|---|
| 8,049,333 B2 | 11/2011 | Alden et al. |
| 2005/0088078 A1 | 4/2005 | Tseng et al. |
| 2005/0127832 A1 | 6/2005 | Toguchi et al. |
| 2008/0210052 A1 | 9/2008 | Allemand |
| 2008/0259262 A1 | 10/2008 | Jones et al. |
| 2009/0321113 A1 | 12/2009 | Allemand et al. |
| 2010/0295446 A1 | 11/2010 | Yamamoto |
| 2011/0163403 A1 | 7/2011 | Bhatia et al. |

OTHER PUBLICATIONS

An et al., "Surface plasmon mediated energy transfer of electrically-pumped excitons," *Optics Express* 18(5):4041-4048, 2010.

(Continued)

*Primary Examiner* — Anthony Ho
(74) *Attorney, Agent, or Firm* — Seed IP Law Group PLLC

(57) ABSTRACT

The present disclosure relates to OLED and PV devices including transparent electrodes that are formed of conductive nanostructures and methods of improving light out-coupling in OLED and input-coupling in PV devices.

23 Claims, 11 Drawing Sheets

(56) References Cited

OTHER PUBLICATIONS

Jin et al., "Silica nanoparticle-embedded sol-gel organic/inorganic hybrid nanocomposite for transparent OLED encapsulation," *Organic Electronics* 13:53-57, 2012.

Koo et al., "Light extraction from organic light-emitting diodes enhanced by spontaneously formed buckles," *Nature Photonics* 4:222-226, 2010.

Riedel et al., "Polymer light emitting diodes containing nanoparticle clusters for improved efficiency," *Organic Electronics* 11:1172-1175, 2010.

Sun et al., "Crystalline Silver Nanowires by Soft Solution Processing," *Nano Letters* 2(2):165-168, 2002.

OPTO-ELECTRICAL DEVICES INCORPORATING METAL NANOWIRES

BACKGROUND

1. Technical Field

This disclosure generally relates to opto-electrical devices such as organic light-emitting diodes (OLEDs) and photovoltaic (PV) cells.

2. Description of the Related Art

An OLED emits light in response to an electric current. The light generation mechanism is based on radiative recombination of excitons of electrically excited organic compound(s). FIG. 1 shows a conventional OLED (10) formed on a substrate (12). An anode (14) is disposed on the substrate. The light-emitting layer takes the form of an organic stack (16) that includes a thin film of electroluminescent chemical compounds (18) flanked by two charge injection layers (20 and 22, one for electron injection and one for hole injection). A cathode (24) is disposed on the organic stack (16).

The cathode and anode provide the contacts for an external circuitry to supply an electrical current, which in turn generates light (26) in the organic stack (16). In general, in a bottom-emitting OLED, the anode (14) and the substrate (12) shall be transparent, allowing the internally generated light (26) to exit from the substrate (12). In a top-emitting OLED, e.g., an OLED display, the cathode (24) shall be transparent, allowing the internally generated light (26) to exit from the cathode. The OLED may be entirely transparent, whereby both the cathode and the anode are transparent. A conventional transparent electrode is indium tin oxide (ITO).

The internally generated light (26) propagates via various modes. Using a bottom-emitting OLED as an example, FIG. 2 schematically shows certain paths of the light propagation. It is desired that the light propagates via an external mode (30), i.e., by traveling through the transparent anode (14) and exiting from the substrate (12). However, not all the light generated from the organic stack is capable of existing via the external mode. Instead, depending on the light incident angle on a given interface, a substantial portion of the light may propagate via a number of waveguide modes. More specifically, at an interface where light enters from a medium of higher refractive index to one of lesser refractive index, a total internal reflection occurs at the interface of the two media for certain light incident angles, whereby no light exits through the interface. As a result, a substantial amount of the light generated from the organic stack is waveguided. One waveguide mode is a combined mode of the ITO layer (14) and the organic stack (16), both of which have comparably high refractive indices. As shown in FIG. 2, light (32) is totally reflected at the interface (34) between the substrate (12) and the combined ITO-organic stack. Another mode is a substrate mode, where the light (38, 40) is reflected at the interface (36) of the substrate and air. As shown, the waveguided light (38) may also exit from the edges of an OLED.

Thus, a critical parameter of OLED performance is the external coupling ("out-coupling") efficiency, which is the ratio of photons emitted externally over photons generated. There is a need for improving the light out-coupling of OLEDs.

BRIEF SUMMARY

Described herein are opto-electrical devices with improved light out-coupling for outputting light (e.g., OLED) or light input-coupling for absorbing light (e.g., photovoltaic cells).

One embodiment provides an optical stack that comprises: a first electrode; an organic stack underlying the first electrode; a nanostructure layer underlying the organic stack, the nanostructure layer comprises a plurality of metal nanostructures; a high-index layer underlying the nanostructure layer; and a substrate underlying the high-index layer, wherein the high-index layer has the same or a higher refractive index than the organic layer, and wherein the nanostructure layer forms a second electrode.

Another embodiment provides an optical stack that comprises: a first electrode; an organic stack underlying the first electrode; a nanostructure layer underlying the organic stack, the nanostructure layer comprises a plurality of metal nanostructures; and a substrate supporting the first electrode, organic stack and nanostructure layer, wherein an energy density of light that would be waveguided in the optical stack without the nanostructure layer is reduced by inclusion of the nanostructure layer in the optical stack.

Another embodiment provides a top-emitting OLED that comprises: a substrate, a first electrode disposed on the substrate; an organic stack disposed on the first electrode; and a nanostructure layer including a plurality of nanostructures overlying the organic stack, wherein the nanostructure layer is a second electrode.

Further embodiments provide processes for fabricating OLEDs through solid-state transfer. One embodiment provides a process that comprises: providing a partial optical stack including a substrate, a cathode disposed on the substrate and an organic stack disposed on the cathode, the partial optical stack having a top surface; providing a donor film including a nanostructure layer on a transfer film, the nanostructure layer including a plurality of nanostructures optionally dispersed in a matrix; and contacting the nanostructure layer of the donor film to the top surface of the partial optical stack.

Another embodiment provides a process that comprises: providing a donor film by (i) depositing a plurality of nanostructures on a release liner; (ii) forming a matrix on the plurality of nanostructures, the matrix having a top surface; (iii) contacting a transfer film to the top surface of the matrix, and (iv) removing the release liner to expose a nanostructure surface; providing a partial optical stack including a substrate, a cathode disposed on the substrate and an organic stack disposed on the cathode, the partial optical stack having a top surface; and contacting the donor film by the nanostructure surface to the top surface of the partial optical stack.

A further embodiment provides a process that comprises: providing a donor film by: (i) forming a matrix on a release liner, the matrix having a top surface; (ii) depositing a plurality of nanostructures on the top surface of the matrix; (iii) reflowing the matrix to form a reflowed matrix; (iv) pressing the nanostructures into the reflowed matrix such that the transfer film contacts the top surface of the matrix; (v) removing the transfer film to expose the top surface; providing a partial optical stack including a substrate, a cathode disposed on the substrate and an organic stack disposed on the cathode, the partial optical stack having a top surface; and contacting the top surface of the donor film with the top surface of the partial optical stack.

Yet another embodiment provides an OLED that comprises: a substrate; a bottom electrode disposed on the substrate; an organic stack disposed on the bottom electrode; and a metal film disposed on the organic stack, wherein the metal film has an outer surface and contacts the organic stack by a metal/organic interface, and wherein a first plurality of nanostructures are disposed on the metal/organic interface.

A further embodiment provides an OLED that comprises: a transparent substrate; a transparent bottom electrode disposed on the transparent substrate; an organic stack disposed on the transparent bottom electrode; and a metal film disposed on the organic stack, wherein the metal film contacts the organic stack by a metal/organic interface and has an outer surface, and wherein a plurality of nanostructures are disposed on the outer surface.

Yet another embodiment provides an OLED that comprises: a substrate having a top surface and a bottom surface, the top surface being an interface between the substrate and air; an anti-reflective layer contacting the bottom surface of the substrate; a first electrode deposited on the anti-reflective layer, the first electrode comprising a plurality of conductive nanostructures; an organic stack deposited on the first electrode, the organic stack comprising an organic light-emitting material, a charge injection layer and a hole injection layer; and a second electrode deposited on the organic stack.

In a further embodiment, the substrate of the OLED has a first refractive index, and the organic stack has a second refractive index, and the anti-reflective layer has a third refractive index, and wherein the third refractive index is larger than the first refractive index and less than the second refractive index.

In further embodiments, the anti-reflective layer of the OLED has an index of reflection in the range of 1.5-1.8. In various embodiments, the anti-reflective layer is a polyimide layer.

Yet another embodiment provides a photovoltaic cell, which comprises: a substrate having a top surface and a bottom surface, the top surface being an interface between the substrate and air; an anti-reflective layer contacting the bottom surface of the substrate; a first electrode deposited on the anti-reflective layer, the first electrode comprising a plurality of conductive nanostructures; a photo-active layer; and a second electrode deposited on the photo-active layer.

In a further embodiment, the substrate of the photovoltaic cell has a first refractive index, and the photo-active layer has a second refractive index, and the anti-reflective layer has a third refractive index, and wherein the third refractive index is larger than the first refractive index and less than the second refractive index.

In a further embodiment, the anti-reflective layer of the photovoltaic cell has an index of reflection in the range of 1.5-1.8. In various embodiments, the anti-reflective layer is a polyimide layer.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been selected solely for ease of recognition in the drawings.

DETAILED DESCRIPTION

As disclosed herein, thin films of interconnecting conductive nanostructures (e.g., silver nanowires) are formed as one or more transparent electrodes in an opto-electrical device such as an OLED or a PV cell. Unlike ITO, which can be costly to process, nanostructure-based electrodes can be advantageously fabricated in a solution-based approach or through a solid state transfer process from a donor layer, making them particularly suitable for large format or high throughput manufacturing.

Nanostructure-Based Bottom Electrode

Figure 2:
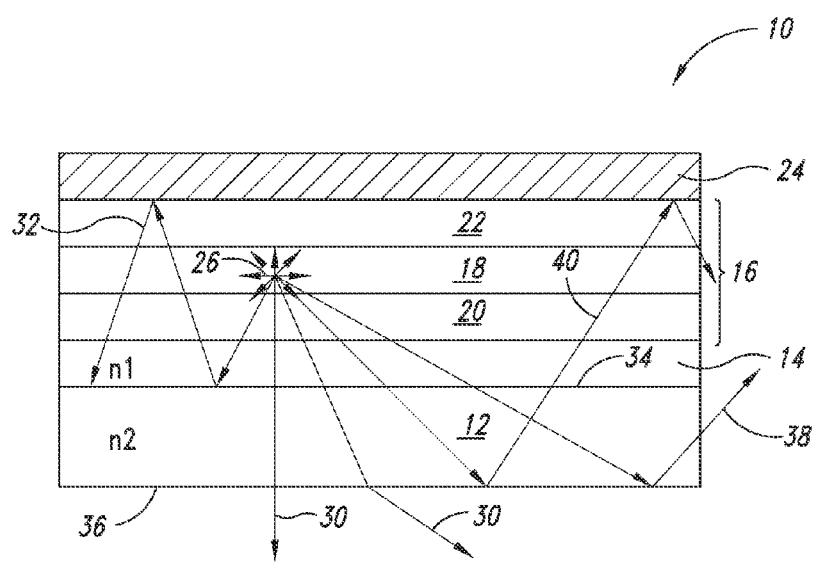
FIG. 2 shows various waveguide modes in an OLED.

As light travels within a multi-layer device stack such as an OLED, the optical behavior of the light can be influenced by at least one, or more typically, all of the layers within the device stack. For instance, when light travels from a medium of a high refractive index to one of a lower refractive index, depending on the angle of the incident light, a certain degree of reflection may occur at the interface between the two media. In a bottom-emitting OLED, the internally generated light must travel from the organic layer and the transparent bottom electrode, then through the substrate in order to exit. Conventionally, because the combined ITO/organic layer has a much higher refractive index ($n_1 \approx 1.8$) than that of the glass substrate ($n_2 \approx 1.5$), a substantial amount of the light can be waveguided in the ITO/organic layer. Likewise, light that travels from the substrate ($n_2 \approx 1.5$) to the air ($n_3 \approx 1$) may also be waveguided in the substrate and the organic/ITO layer (see FIG. 2).

Various embodiments are directed to OLEDs in which conductive nanostructure-based transparent conductors are used in place of the conventional ITO layer. By simply eliminating the high-index-material such as ITO, the distribution of the waveguide modes can be modified. However, the large difference between the indices of refraction of the glass and the organic layer will still cause losses due to total internal reflection at this interface. Thus, to further enhance light out-coupling and reduce internal reflection, an anti-reflective layer is interposed between the substrate and the bottom electrode formed by the nanostructure layer. Because the nanostructure layer is a network of interconnecting nanostructures (e.g., metal nanowires) rather than a continuous layer, it does not completely inhibit the optical interaction between the organic layer and the anti-reflection layer.

Figure 3A:
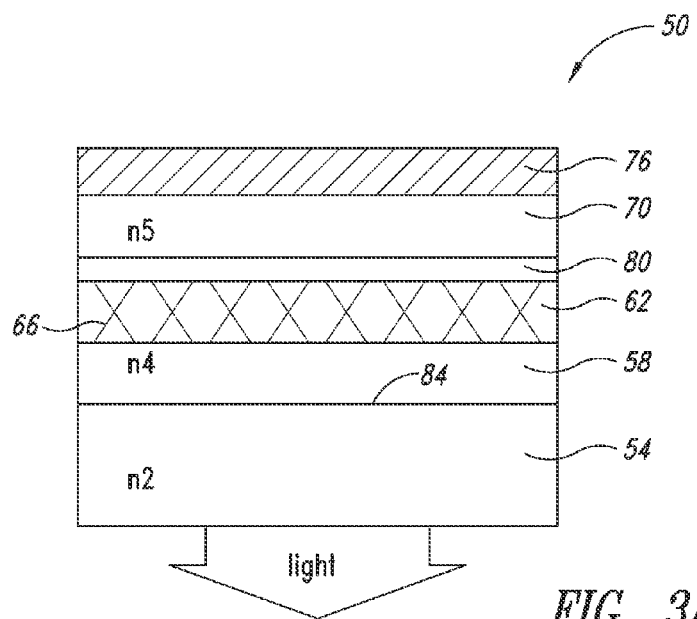
FIGS. 3(A)-3(B) shows a bottom-emitting OLED according to an embodiment of the present disclosure.

FIG. 3A shows an OLED (50) according to an embodiment of the present disclosure. The OLED (50) includes a transparent substrate (54), an anti-reflective layer (58) interposed between the transparent substrate (54) and a nanostructure layer (62). The nanostructure layer comprises a plurality of metal nanostructures (66) and acts as an anode (i.e., the bottom electrode). An organic stack (70) is situated between the anode and a cathode (76).

Optionally, an intermediate conductive layer (80) may be interposed between the organic stack (70) and the nanostructure layer (62). The intermediate conductive layer is sufficiently conductive such that the current is laterally distributed to achieve a uniform carrier injection into the organic stack (e.g., the light-emitting layer), thereby providing uniform electroluminescence. The intermediate conductive layer may be, for example, a thin ITO layer, or a conductive polymer layer, or a layer of evenly distributed nanoparticles or nanowires. More detailed description of such a composite structure of the nanostructure layer (62) and the intermediate conductive layer (80) may be found in, for example, U.S. Published Application No. 2008/02592, in the name of Cambrios Technologies, the assignee of the present disclosure.

In various embodiments, the index of refraction of the anti-reflective layer ($n_4$) should be a value between those of the substrate ($n_2$) and the organic stack ($n_5$). More specifically, the index of refraction of the anti-reflective layer may be in the range of 1.5-1.8, or in the range of 1.55-1.6, or in the range of 1.6-1.65, or in the ranges of 1.65-1.7, or 1.7-1.75, or 1.75-1.8. For the most efficient reduction of internal reflection, the index of refraction ($n_4$) may be ascertained according to the following formula:

$$\sqrt{n_2 \times n_5}$$

Thus, given the indices of refraction of glass ($n_2 \approx 1.5$) and the organic stack ($n_5 \approx 1.8$), respectively, the index of refraction ($n_4$) of the anti-reflective layer (58) should be 1.6 for this particular configuration. In a preferred embodiment, the anti-reflective layer is a polyimide layer.

The anti-reflective layer can be formed by direct deposition on the substrate. In forming the bottom electrode, conductive nanostructures can be formulated into an ink composition (described in further detail below) and deposited directly on the anti-reflective layer. Such a solution-based approach enables large format and/or high throughput fabrication. Thereafter, the organic stack can be formed by known methods of the art. Because the organic stack is typically sensitive to water, prior to the formation of the organic stack, care should be taken to ensure that the nanostructure layer is free of water, which is a common solvent in the nanostructure ink composition.

Figure 3B:
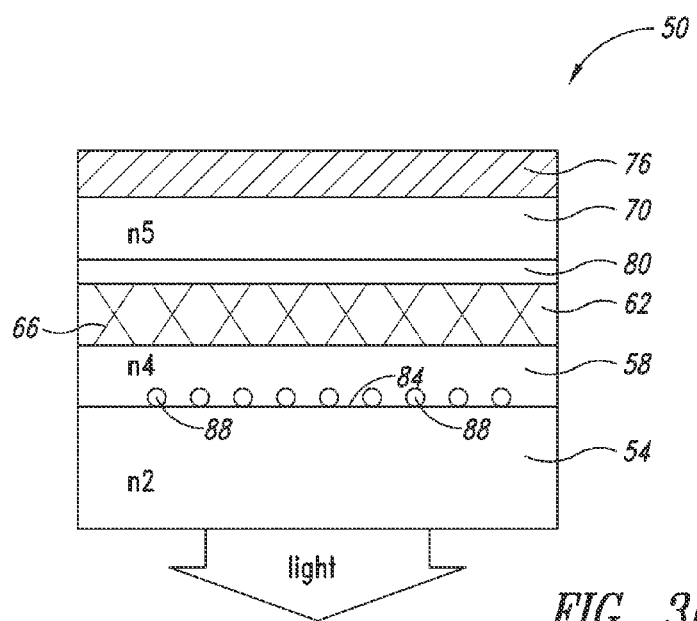

Certain waveguiding may also occur within the anti-reflective layer (58) due to the reflection at its interface (84) with the transparent substrate (54). Thus, in another embodiment, as shown in FIG. 3B, the anti-reflective layer (58) may further contain a plurality of light-scattering nanoparticles (88). The presence of the light-scattering nanoparticles may force the waveguided or trapped light in the anti-reflective layer out (also referred to as "extraction"). These light-scattering nanoparticles are also referred to as "scattering centers."

In yet another embodiment, particle-based scattering centers may also be used in a PV cell in conjunction with a nanostructure-based electrode. An PV cell comprises a photo-active layer, which absorbs light and converts it into an electrical current. In certain embodiments, the photo-active layer is organic and the PV cells are also referred to as organic photovoltaic (OPV) cells. Unless specified otherwise, the embodiments described herein are equally applicable to PV and OPV cells.

Figure 4A:
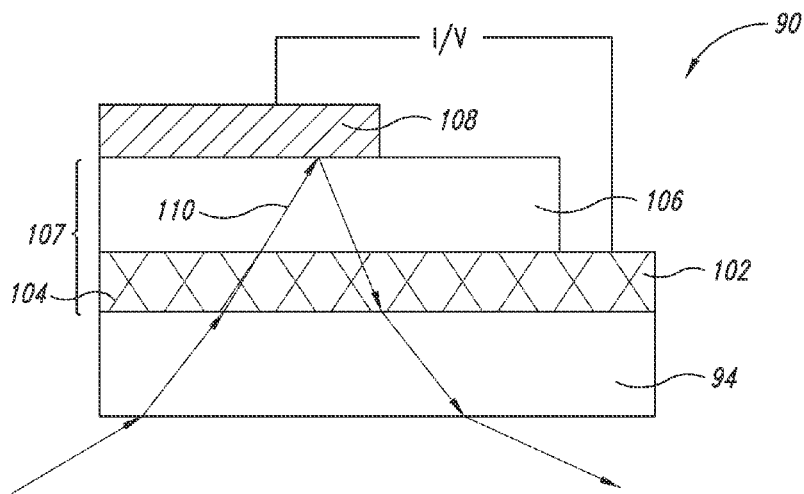
FIGS. 4(A)-4(B) shows a PV cell according to another embodiment of the present disclosure.

FIG. 4A shows an OPV cell (90) according to an embodiment. The OPV cell (90) includes a transparent substrate (94) and an overlying nanostructure layer (102). The nanostructure layer comprises a plurality of metal nanostructures (104) and acts as an electrode (e.g., anode). A photo-active layer (106) is situated between the nanostructure layer (102) and a cathode (108). Because the photo-active layer (106) and the nanostructure layer (102) have high indices of refraction of comparable values, they form a combined optical stack (107) in the propagation path of light (110).

For an OPV device to work efficiently, the ratio of the absorbed photons to the input photons need to be maximized. To maximize light absorption, the travel length or total travel time of the light (110) within the photo-active layer should be as long as possible. In other words, it is desirable for the light (110) to be waveguided within the combined optical stack (107). However, because it is not possible to create internal reflection within the combined optical stack, waveguiding can only be created by incorporating scattering centers therein.

Figure 4B:
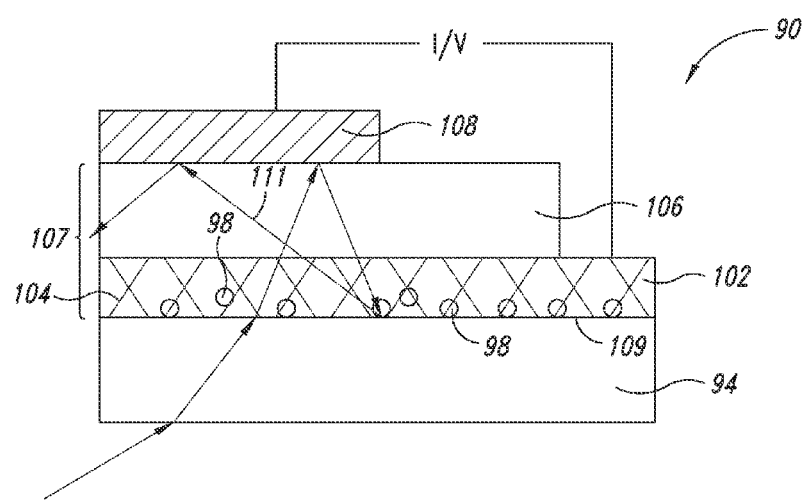

FIG. 4B shows an embodiment for effectively creating waveguiding in an OPV device. In particular, a plurality of nanoparticles is incorporated at the interface (109) of the combined optical stack (107) and the substrate (94). The nanoparticles, as scattering centers, facilitate the waveguiding for light (111). In contrast to light (110) of FIG. 4A, light (111) of FIG. 4B is waveguided within the photo-active layer, thereby extending its total travel length and maximizing the light absorption.

The OPV device can be fabricated in a similar sequence as the OLED disclosed herein. In forming the electrode, conductive nanostructures can be formulated into an ink composition (described in further detail below) and deposited directly on the substrate. The scattering centers (e.g., nanoparticles) may be formed by direct deposition on the substrate simultaneously with the nanostructures. Alternatively, the nanoparticles may be deposited prior to or subsequently to the deposition of the nanostructures. Thereafter, the photo-active layer can be formed by known methods of the art, followed by the formation of the top electrode, which can be a metal plate.

Nanostructure-Based Top Electrode

Nanostructure layers are also suitable for replacing the ITO layer in a conventional top-emitting OLED.

Figure 5:
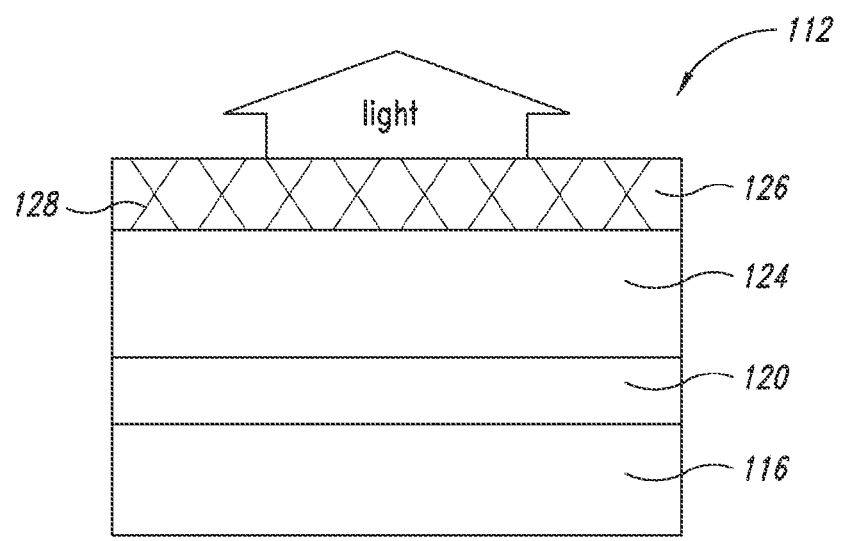
FIG. 5 shows a top-emitting OLED according to an embodiment of the present disclosure.

FIG. 5 schematically shows a top-emitting OLED according to an embodiment of the present disclosure. The top-emitting OLED (112) includes a substrate (116), a cathode (120) disposed on the substrate (116), an organic stack (124) disposed on the cathode (120); and a nanostructure layer (126) including a plurality of nanostructures (128). The nanostructure layer forms the transparent anode and top electrode of the OLED. The substrate and the cathode need not be transparent. In certain embodiments, the cathode may be connected to a thin film transistor (TFT). It should also be recognized that the anode and the cathode could be exchanged or reversed.

It may be challenging to form a nanostructure layer as the top electrode, due in part to the solvent sensitivity of the underlying organic stack. In particular, it is impracticable to deposit a nanostructure ink composition directly on the organic stack because the solvent, typically containing water, may significantly destabilize or degrade the organic stack.

Thus, as an alternative to the solution-based approach, one embodiment provides a method of forming a nanostructure layer on an organic stack through solid-state transfer process using a donor film. More specifically, a donor film is fabricated by pre-forming a nanostructure layer a transfer film through a solution-phase deposition, and allowing the solvent to fully evaporate. The nanostructure layer is then transferred to the organic stack, thereby avoiding direct solvent contact with the organic stack.

Figure 6:
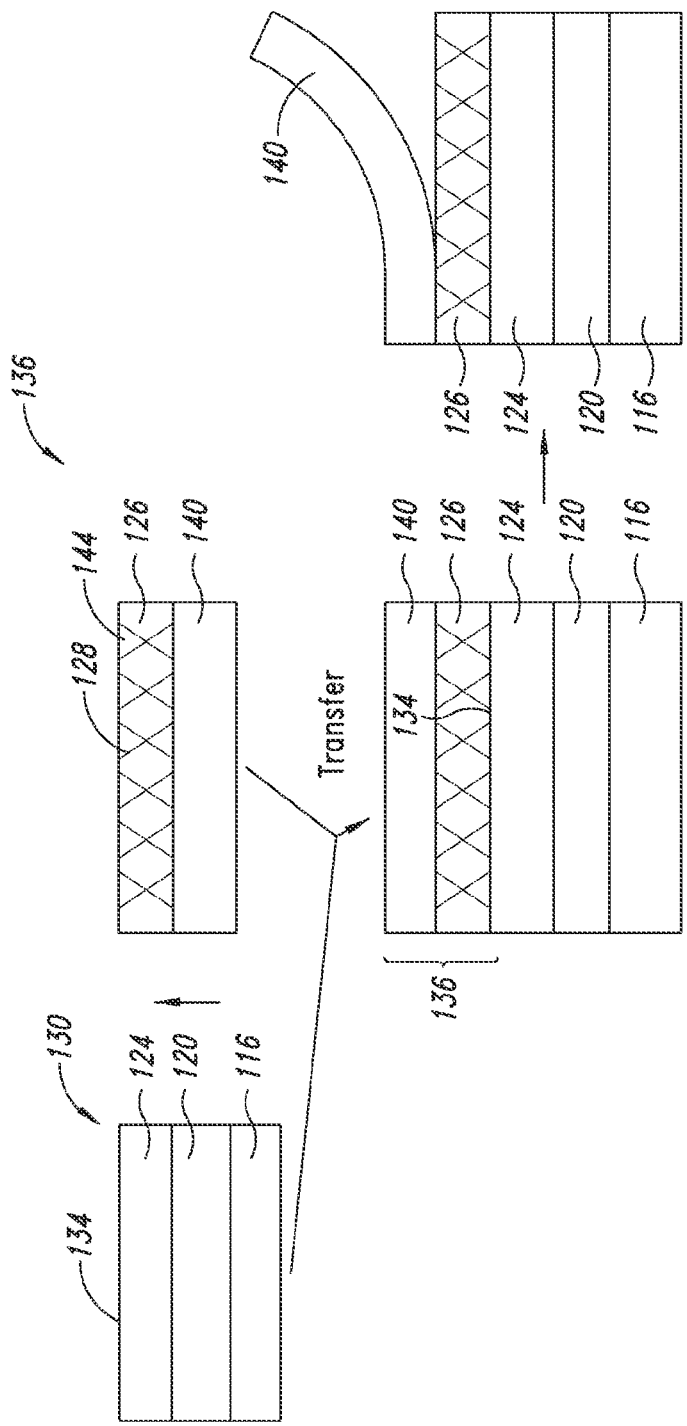
FIG. 6 shows a solid-state transfer process according to an embodiment of the present disclosure.

As illustrated in FIG. 6, one embodiment provides a method comprising:

providing a partial optical stack (130) including a substrate (116), a cathode (120) disposed on the substrate (116) and an organic stack (124) disposed on the cathode (120), the partial optical stack having a top surface (134);

providing a donor film (136) including a nanostructure layer (126) on a transfer film (140), the nanostructure layer including a plurality of nanostructures (128) optionally dispersed in a matrix (144); and contacting the nanostructure layer (126) of the donor film (136) to the top surface (134) of the partial optical stack (130).

In a further embodiment, the method further comprises removing the transfer film (140).

In forming the donor film, an ink composition of nanostructures may be deposited directly on the transfer film by known methods in the art, including slot die coating, spray coating, reverse offset printing, and the like. The nanostructure layer forms after the volatile components of the ink composition are removed.

In another embodiment, the ink composition may further comprise a matrix material (e.g., a binder). In this approach, the nanostructures and the binder are co-deposited on the transfer film. Following deposition and matrix curing, the nanostructures are dispersed in the matrix in a substantially uniform manner, i.e., the nanostructures are distributed throughout the entire thickness of the matrix. Although the matrix may be conductive (e.g., conductive polymer) or non-conductive (e.g., dielectric polymer), the nanostructure layer is conductive due to the percolative conductivity between contacting nanostructures.

Figure 7:
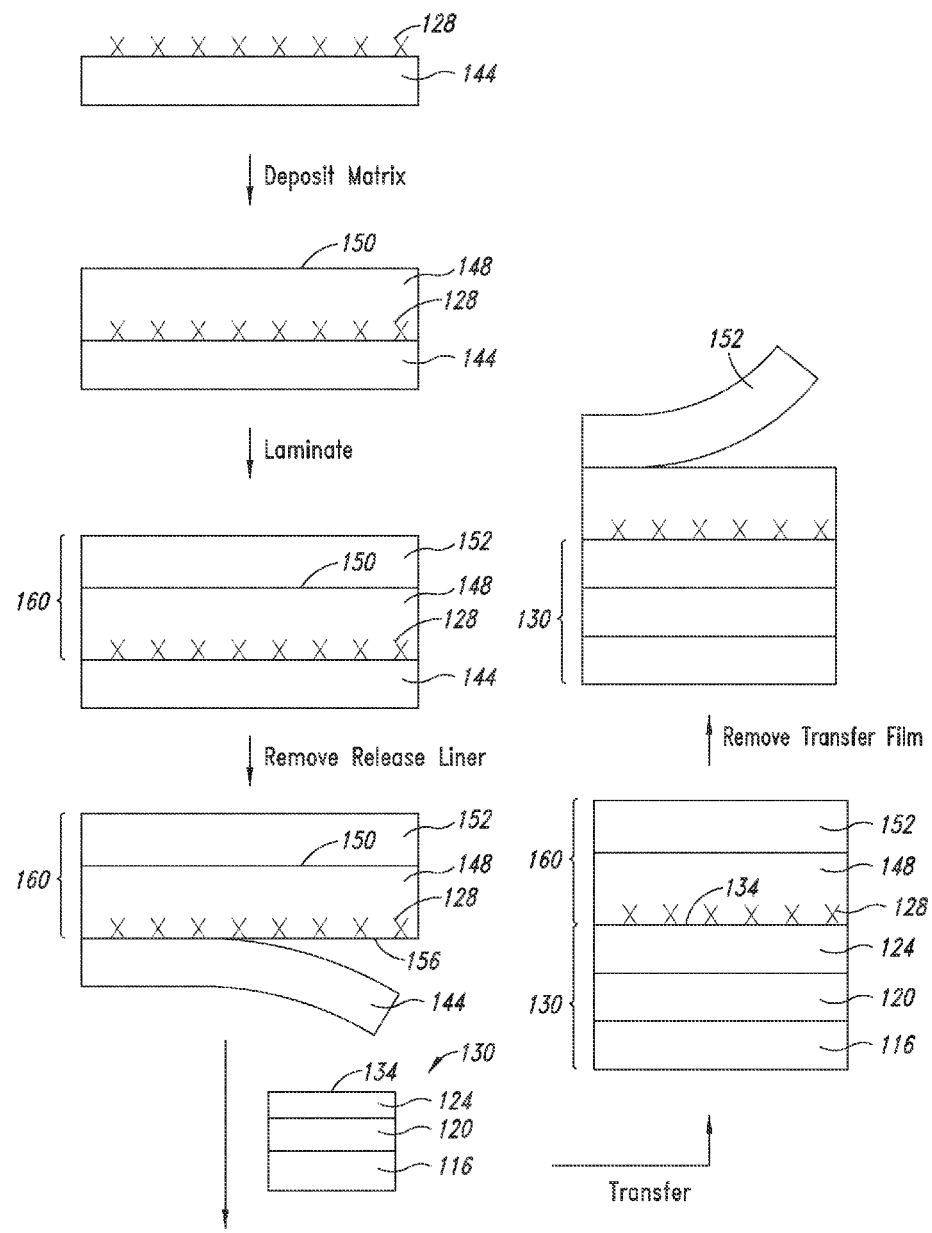
FIGS. 7-8 show alternative solid-state transfer processes according to embodiments of the present disclosure.

Another embodiment slightly alters the solid-state transfer approach by separately depositing the nanostructures and the matrix, thereby allowing for more flexibility of the amount and the thickness of the matrix, while maintaining electrical contact between the nanostructures and the organic stack. In addition, a release liner is employed to provide a smooth surface of the conductive layer for contacting the organic stack. More specifically and as illustrated in FIG. 7, the method comprises:

providing a donor film (160) by
(i) depositing a plurality of nanostructures (128) on a release liner (144);
(ii) forming a matrix (148) on the plurality of nanostructures (128), the matrix having a top surface (150);
(iii) contacting a transfer film (152) to the top surface (150) of the matrix (148), and
(iv) removing the release liner (144) to expose a nanostructure surface (156);

providing a partial optical stack (130) including a substrate (116), a cathode (120) disposed on the substrate (116) and an organic stack (124) disposed on the cathode (120), the partial optical stack having a top surface (134);

contacting the donor film (160) by the nanostructure surface (156) to the top surface (134) of the partial optical stack.

In a further embodiment, the method further comprises removing the transfer film (152).

In yet another embodiment, the method further comprises first forming an intermediate conductive layer on the organic stack prior to contacting the donor film to the organic stack. The intermediate conductive layer is preferably a continuous film such as a thin layer of ITO or conductive polymer. Such an intermediate conductive film can be helpful to ensure that the contact between the nanostructures and the organic stack is uniform.

When prepared for deposition, the matrix may be combined with an appropriate solvent to assist with flowability, or deposited as neat if it is a flowable material. Following the deposition, the matrix cures or hardens into a solid layer, either through removal of the solvent(s) and/or crosslinking. In certain embodiments, the matrix is a thermoplastic polymer that, even after curing, may become reflowable upon heating or solvent infiltration, and hardened again upon cooling or solvent evaporation. Generally speaking, crosslinked matrix may be formed through a photo-initiated or heat-initiated process and, once hardened, is incapable of reflowing even upon further heating.

Advantageously, once the matrix is formed (cured and hardened), the release liner can be removed, leaving a surface (156) of the nanostructure layer smooth and ready to make contact with the organic stack. Moreover, although the nanostructures are not necessarily distributed throughout the entire height of the matrix; the nanostructure layer contacts the organic stack by the nanostructure surface (156) to ensure maximum and uniform contact between the nanostructures and the organic stack.

Figure 8:
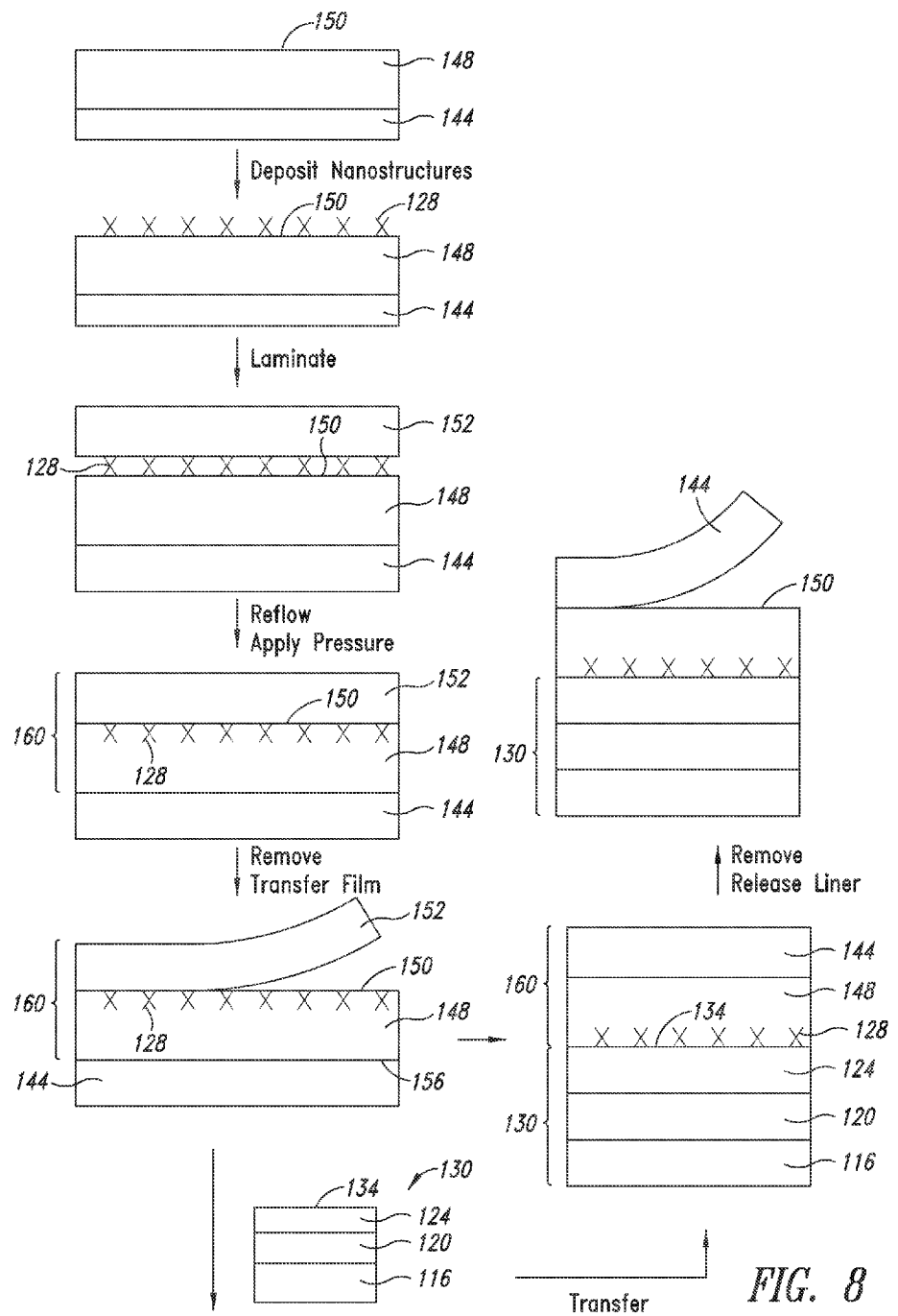

Yet another embodiment provides an alternative approach to achieving a smooth contacting surface in the nanostructure layer. The method involves first depositing a matrix on a release liner, followed by depositing nanostructures. The nanostructures are not impacted into the matrix, but are deposited on the top surface of the matrix. The matrix may be still flowable (prior to a fully cured state) or can be heated to a reflowed state. The reflowed matrix is in a semi-solid state and readily deformable such that the nanostructures can be pressed into the matrix. More specifically and as illustrated in FIG. 8, the method comprises:

providing a donor film (160) by:
(i) forming a matrix (148) on a release liner (144), the matrix having a top surface (150);
(ii) depositing a plurality of nanostructures (128) on the top surface (150) of the matrix (148);
(iii) applying a transfer film (152) on the plurality of nanostructures (128);
(iv) reflowing the matrix (148) to form a reflowed matrix;
(v) applying pressure to the transfer film (152) to press the nanostructures (128) underlying the transfer film (152) into the reflowed matrix such that the transfer film contacts the top surface (150) of the matrix (148);
(vi) removing the transfer film (152) to expose the top surface (150);

providing a partial optical stack (130) including a substrate (116), a cathode (120) disposed on the substrate (116) and an organic stack (124) disposed on the cathode (120), the partial optical stack having a top surface (134);

contacting the top surface (150) of the donor film (160) with the top surface (134) of the partial optical stack (130).

In a further embodiment, the method further comprises removing the release liner (144).

In an alternative embodiment, the method may omit the step of laminating the transfer film (152). Instead, the nanostructures 128 may be calendered with a calender roll directly into the reflowed matrix.

In yet another embodiment, the method further comprises first forming an intermediate conductive layer on the organic stack prior to contacting the donor film to the organic stack. The intermediate conductive layer is preferably a continuous film such as a thin layer of ITO or conductive polymer. Such an intermediate conductive film can be helpful to ensure that the contact between the nanostructures and the organic stack is uniform.

In the processes described above, it is possible that non-conductive contaminating materials can be inadvertently introduced during the depositions. Their presence on the nanostructure surface (156 in FIG. 7 or 150 in FIG. 8) may inhibit the carrier injection/extraction. Accordingly, the method may further comprise, prior to contacting the organic stack, surface treating the nanostructure surface of the donor film to minimize or eliminate any non-conductive contaminant. The surface treatment may involve Argon-plasma (or nitrogen-plasma) for a brief period of time. This surface treatment effectively removes thin deposition of contaminants on the nanostructure surface, thereby improving carrier injection/extraction. Additionally, the surface treatment achieves a slight back-etching of the matrix, which provides a better electric contact with the organic stack or the intermediate conductive layer.

The choice of the matrix is dictated by a number of factors. On one side, the matrix has to provide some mechanical adhesion to the organic stack (e.g., pressure sensitive adhesive). On the other side, the matrix also offers the ability to tailor the optical characteristics such as the index of refraction, incorporation of scattering centers, incorporation of down-converter dyes, etc. The matrix can therefore be used to optimize the optical stack with respect to light extraction, emission uniformity and emission color. Thus, as disclosed in further detail herein, in various embodiments, the matrix can be a crosslinkable polymer or a reflowable polymer. The matrix may also be an optical clear adhesive. In addition, the matrix may also possess tailored optical properties (index of refraction, absorption, color etc.) and contain particles to impact the optical performance (e.g., scattering particles, etc.)

The matrix may also be patterned, e.g., by UV irradiation, prior to transfer. In this case, exposure to the UV irradiation in selected areas of the matrix causes crosslinking in the selected areas only, whereas the non-exposed areas can be removed. The resulting pattern can then be transferred onto the organic stack. As an alternative to UV irradiation, LITI (Laser Induced Thermal Imaging) can also be used to locally transfer the material onto the organic stack.

It should be understood that although the solid-phase transfer process is particularly suitable for forming a top electrode, it is not limited to top electrodes. The process equally applies to forming bottom electrodes. It should further be understood that, although OLED is illustrated, the processes disclosed herein apply equally to PV devices (e.g., OPV). That solid-phase transfer process ensures that the conductive network of nanostructures is exposed on one surface (156 in FIG. 7 or 150 in FIG. 8) that contacts the organic stack (e.g., a light-emitting layer in an OLED or a photo-active layer in a PV cell), thus providing carrier injection/extraction in OLED and PV devices.

Surface Plasmon Polariton Suppression

Figure 1:
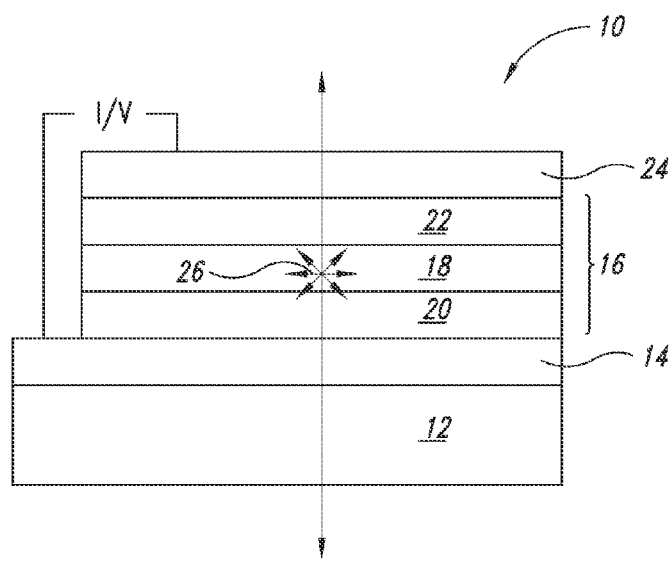
FIG. 1 shows a prior art OLED.

In a conventional bottom-emitting device, a solid metal cathode is typically used as the top electrode (see FIG. 1). At the interface of the metal and organic stack, energy losses may occur due to surface plasmon polaritons (SPP) or dipole interactions. Such energy loss decreases the efficiency of the device. It has been shown that a higher roughness of the metal surface reduces the energy loss at this interface, see for example: Koo et al. *Nature Photonics* 4, 222 (2010) or An et al. *Optics Express* 8 (5), p 4041 (2010).

Various embodiments provide devices in which nanostructures are placed on either or both sides of the metal electrode. The presence of the nanostructures increases surface roughness, thereby reducing SPP. It should be noted that it is not necessary to have a conductive network of nanostructures. Rather, surface roughness may be sufficiently achieved by providing non-percolating nanostructures (e.g., nanowires or simply nanoparticles).

Figure 9A:
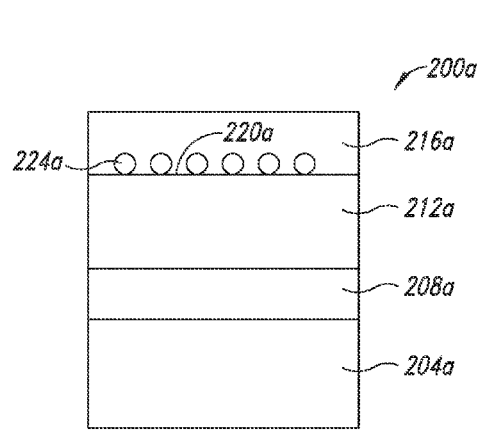
FIGS. 9(A)-9(D) show various embodiments directed to OLED configurations that reduce surface plasmon polaritons (SPP).

One embodiment provides placing nanostructures at the interface of the metal cathode and the organic stack. As illustrated in FIG. 9(A), an OLED (200*a*) comprises a substrate (204*a*), a bottom electrode (208*a*) disposed on the transparent substrate, an organic stack (212*a*) disposed on the transparent bottom electrode, and a metal film/cathode (216*a*) disposed on the organic stack (212*a*), wherein the metal film (216*a*) contacts the organic stack (212*a*) by a metal/organic interface (220*a*), and wherein a plurality of nanostructures (224*a*) are disposed on the metal/organic interface (220*a*).

Figure 9B:
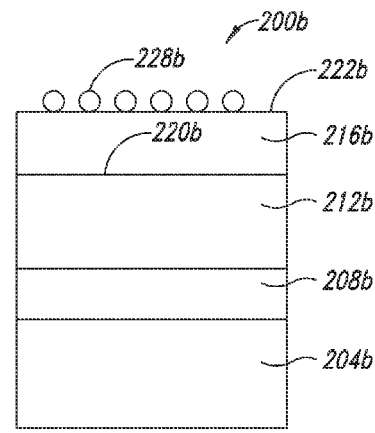

Because the metal cathode in an OLED is very thin (hundreds of nanometers or less), SPP are also coupled at the outer surface of the metal cathode due to its close proximity of the metal/organic interface. Placing nanostructures at the outer surface of the metal film can perturb the propagation of SPP and lower the SPP losses in the OLED device. Thus, as illustrated in FIG. 9(B), an OLED (200*b*) comprises a substrate (204*b*), a bottom electrode (208*b*) disposed on the transparent substrate, an organic stack (212*b*) disposed on the transparent bottom electrode, and a metal film/cathode (216*b*) disposed on the organic stack (212*b*), wherein the metal film (216*b*) contacts the organic stack (212*b*) by a metal/organic interface (220*b*) and has an outer surface (222*b*), and wherein a plurality of nanostructures (228*b*) are disposed on the outer surface (222*b*).

Figure 9C:
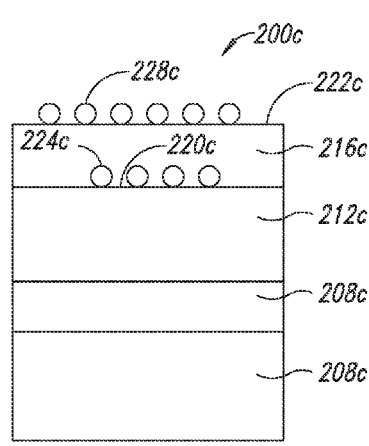

In a further embodiment, nanostructures may be placed on both sides of the metal film. As illustrated in FIG. 9(C), an OLED (200*c*) comprises a substrate (204*c*), a bottom electrode (208*c*) disposed on the transparent substrate, an organic stack (212*c*) disposed on the transparent bottom electrode, and a metal film/cathode (216*c*) disposed on the organic stack (212*c*), wherein the metal film (216*c*) contacts the organic stack (212*c*) by a metal/organic interface (220*a*) and has an outer surface (222*c*), and wherein a first plurality of nanostructures (224*c*) are placed on the metal/organic interface (220*c*), and a second plurality of nanostructures (228*c*) are disposed on the outer surface (222*c*).

There are a number of approaches to deposit nanostructures on the outer surface of the metal film/cathode. In certain embodiments, since the metal film acts as a barrier of the organic stack, a solution-based approach to depositing nanostructures may be employed, including spin coating, slot-die coating, printing, and the like.

Figure 9D:
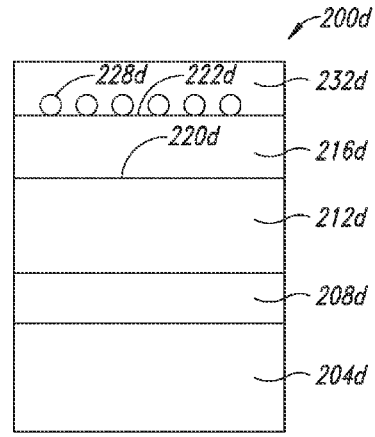

Alternatively, a transfer film may be used (as described herein). FIG. 9(D) illustrates an OLED (200*d*) comprises a substrate (204*d*), a bottom electrode (208*d*) disposed on the transparent substrate, an organic stack (212*d*) disposed on the transparent bottom electrode, and a metal film/cathode (216*d*) disposed on the organic stack (212*d*), wherein the metal film (216*d*) contacts the organic stack (212*d*) by a metal/organic interface (220*d*) and has an outer surface (222*d*), and wherein a plurality of nanostructures (228*d*) are disposed on the outer surface (222*d*) and are embedded in a matrix (232*d*). The nanostructures and the matrix have been previously formed on a transfer film (e.g., FIG. 7 or 8), and transferred to the outer surface (222*d*) of the OLED.

The matrix may be any of the matrix described herein. In these embodiments (e.g., FIGS. 9A-9D), the optical properties of the matrix will not play a major role because the OLEDs are bottom-emitting. In certain embodiments, the matrix is opaque.

Placing nanostructures at the metal/organic interface, however, is not compatible with the solution-based approach because of the solvent-sensitivity of the organic stack. Thus, nanostructures may be transferred onto the metal/organic interface in a solid-state process before the metal film is deposited, e.g., by physical vapor deposition.

Positioning the Scattering Centers

In further embodiments, light out-coupling in an OLED device can be further improved by maximizing the efficiencies of the scattering centers in the OLED device. As light travels through the device stack, it propagates in one or more modes. Scattering centers can be strategically positioned to interfere with the behaviors of the propagating light, especially those of the otherwise waveguided light. In particular, an energy density of light that would have been waveguided in an optical stack without the scattering centers can be reduced by inclusion of the scattering centers in the optical stack. However, for optical stacks that involve high refractive index layers (e.g., organic layer of an OLED or an organic photoactive layer of an OPV cell), waveguided light may have such limited amount of interaction with the scattering centers that the scattering centers cannot be employed efficiently.

Figure 10:
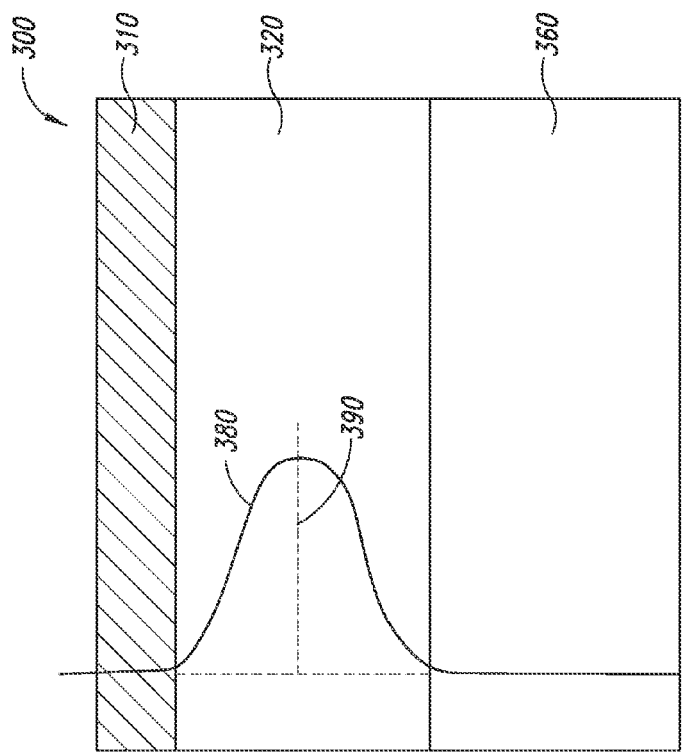
FIG. 10 shows waveguided light represented by its energy density within a device stack.

FIG. 10 shows how waveguided light may not interact with the scattering centers in any appreciable way. In particular, FIG. 10 shows the energy density distribution of the propagating light in a simplified device stack (300). The device stack includes a first electrode (310), an organic stack (320), and a glass substrate (360). Light generated by the organic stack propagates within the device stack before it exits through the glass substrate. As described herein, the waveguide mode is mostly supported within the organic stack due to the index difference between the organic stack (320) and the substrate (360). As the energy density of the waveguided light is represented by a bell curve (380), the maximum (390) of the bell curve is approximately centered within the organic stack. Such waveguiding in the organic layer causes the light to have little or a minimum interaction with any element beyond the organic stack (i.e., light scattering centers that underlie the organic stack, which are not shown for sake of clarity).

Figure 11:
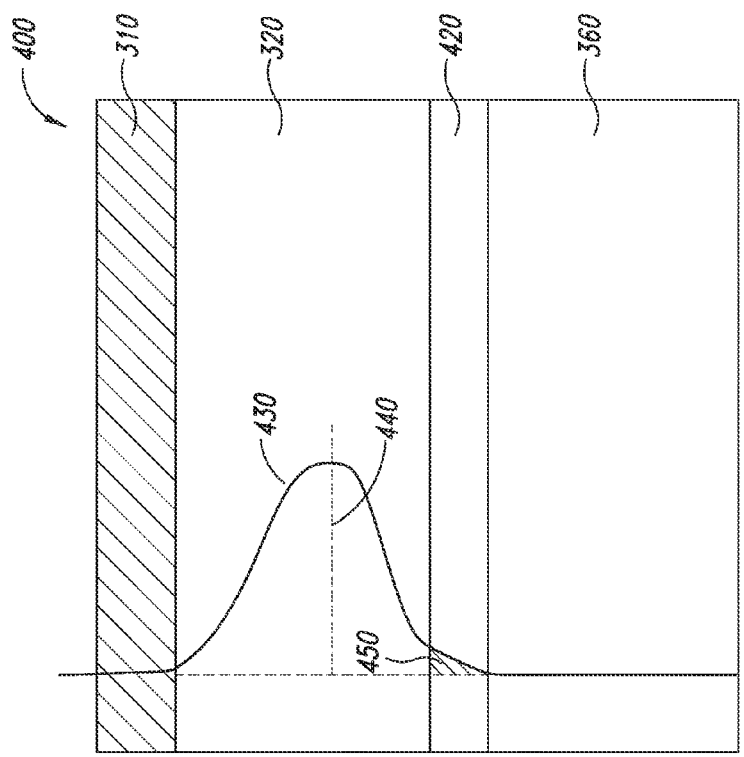
FIG. 11 shows the impact of a high-index layer for modifying the energy density of the waveguide light.

For the scattering centers to work more efficiently, they must be closer to (preferably at) the maximum intensity of the waveguided light within the organic stack. FIG. 11 shows how the energy density distribution curve is drawn away from the center of the organic stack, thereby shifting closer to one end of the organic stack. More specifically, in an optical stack (400), a high-index layer (420) is disposed between the organic stack (320) and the substrate (360). The high-index layer has a comparably high-index of refraction as that of the organic stack. Because of the optical continuity between the organic layer (320) and the high-index layer (420), the energy density curve (430) extends into said high-index layer (420). As a result, the maximum of the curve (430) shifts toward the high-index layer (420), resulting in a greater overlap (450) with the high-index layer.

Figure 12:
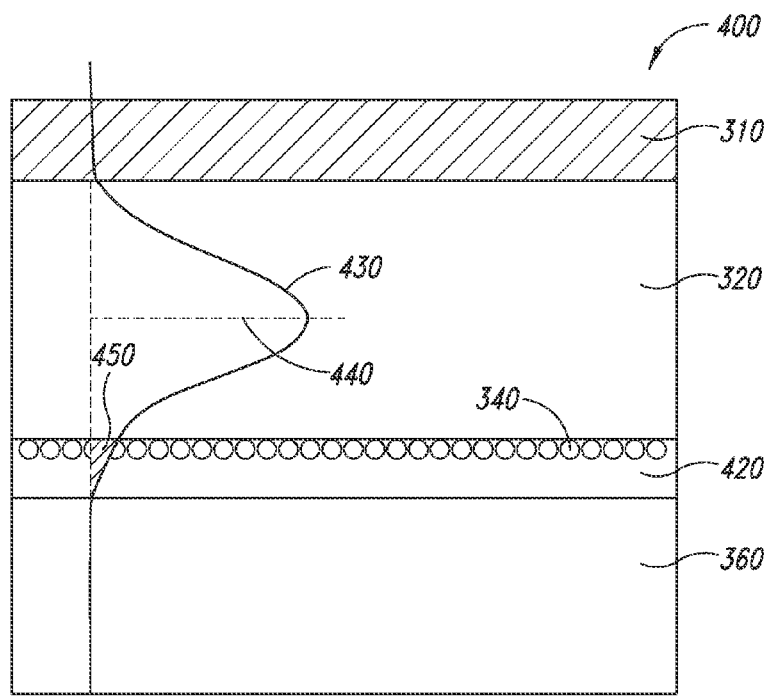
FIGS. 12-15 show various embodiments in accordance with the disclosure for incorporating a high-index layer in an optical stack device.

Thus, in one embodiment, the energy density distribution can be modified in a way that its maximum is being shifted towards the location of the scattering particles. FIG. 12 is based on the concept of FIG. 11, and incorporates a plurality of nanostructures (340) between the organic stack (320) and the high-index layer (420). These nanostructures (e.g., silver nanowires) function as the second electrode in an OLED device, as well as scattering centers, which can facilitate extracting the light generated and waveguided in the organic stack. The overlap (450) between the scattering centers (340) and the energy density distribution curve (430) substantially increases as compared to the stack without the high-index layer (e.g., FIG. 10), thereby increasing the efficiency of the scattering centers for extracting the light. The overlap is defined as the under-curve area (in percentage) of the portion of the energy density distribution curve that extends beyond the organic stack as compared to the entire under-curve area of the curve. An example is area 450 of FIG. 11. Typically, the larger the overlap, the more efficient it is for the scattering centers to extract the waveguided light. In various embodiments, the scattering centers are positioned in an overlapped area that is at least 2%, or at least 3% or at least 5%, or at least 10%, or at least 30% or at least 50% to achieve the desired result.

As used herein, the "high-index" layer has a refractive index at least the same or more than the refractive index of the organic layer in which the mode is propagating. Typically, the high-index layer has a refractive index of 1.55 or higher, or preferably 1.6 or higher, or more preferably, 1.7 or higher, or more preferably, 1.8 or higher.

Various embodiments describe different approaches to incorporating a high-index layer (420) that facilitate the efficiency of light scattering centers (340). It should be understood that it is possible to introduce several layers of scattering particles and its corresponding high-index layer to correspond to different locations of waveguide modes.

Figure 13:
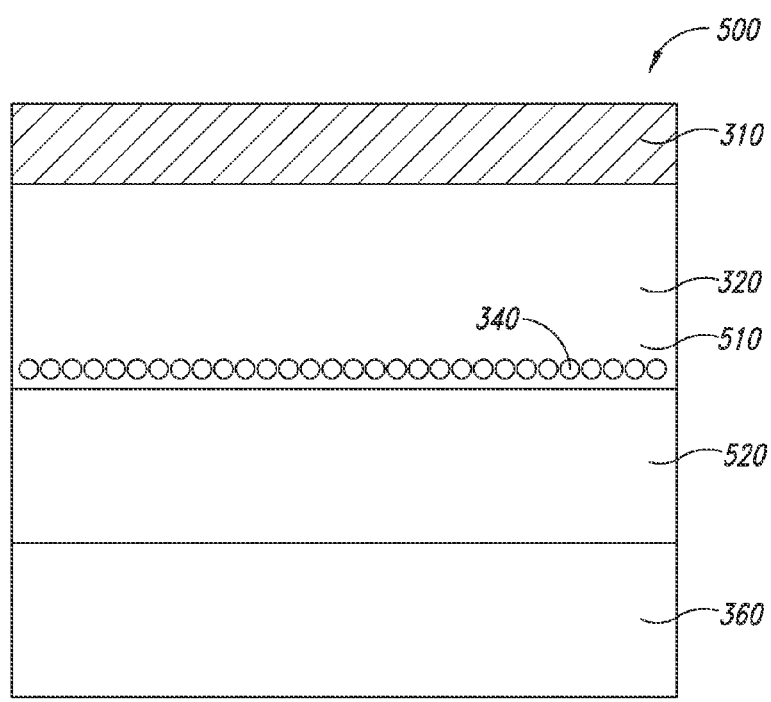

FIG. 13 shows an embodiment according to the present disclosure. A device stack (500) includes a first electrode (310), an organic stack (320), a second electrode (510) having a plurality of interconnecting/networking nanostructures (340), a high-index layer (520) underlying the nanostructures (340) and a substrate (360). In this embodiment, there is no insulating binder or matrix, and the second electrode is formed by directly depositing the nanostructures on the high-index layer. If processing concern requires that a binder material be present during coating of the nanostructures on the high-index layer, the binder may be subsequently removed (e.g., by washing or plasma treatment) before forming the organic stack (320).

Figure 14:
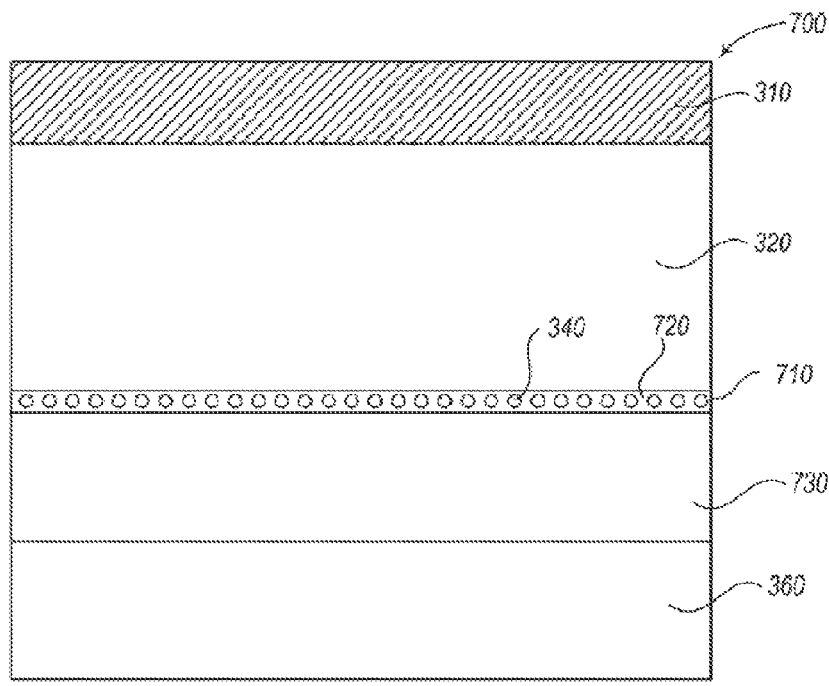

FIG. 14 shows a further embodiment according to the present disclosure. Device stack (700) combines the characteristics of device stacks (500) and (600). As shown, the device stack (700) includes a first electrode (310), an organic stack (320), a second electrode (710) having a plurality of interconnecting/networking nanostructures (340) embedded in a first high-index layer or matrix (720), a second underlying high-index layer (730), and a substrate (360).

Figure 15:
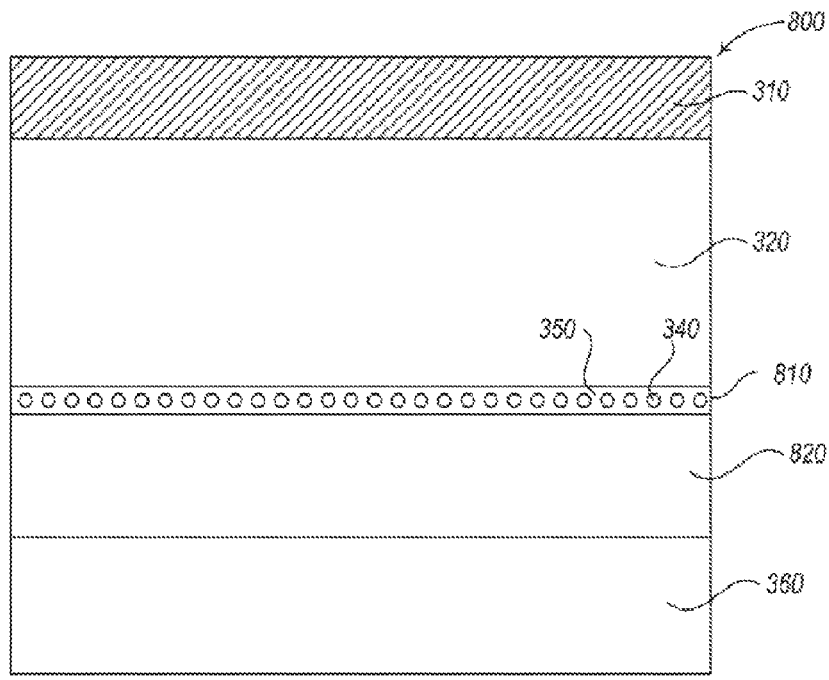

FIG. 15 shows yet another embodiment according to the present disclosure. As shown, a device stack (800) includes a first electrode (310), an organic stack (320), a second electrode (810) having a plurality of interconnecting/networking nanostructures (340) embedded in a low-index matrix or binder 350, a high-index layer (820) underlying the second electrode, and a substrate (360). In this embodiment, the binder is deposited with the nanostructures on the high-index layer (820) to form the electrode (810). The low-index binder then remains in the electrode and should have a lower refractive index than the organic stack or the high-index layer.

In any of the embodiments described herein, the high-index layer can further include additional scattering centers, i.e., light scattering particles as defined herein.

In addition, the embodiments described in connection with waveguide mode modification can apply to top-emitting devices as well, in which case the complete stack of the device (including the nanowire layer and high-index layer) are to be reversed.

The various components are described in more detail below.

Conductive Nanostructures

Generally speaking, the transparent conductors described herein are thin conductive films of conductive nanostructures. In the transparent conductor, one or more electrically conductive paths are established through continuous physical contacts among the nanostructures. A conductive network of nanostructures is formed when sufficient nanostructures are present to reach an electrical percolation threshold. The electrical percolation threshold is therefore an important value above which long range connectivity can be achieved.

As used herein, "conductive nanostructures" or "nanostructures" generally refer to electrically conductive nano-sized structures, at least one dimension of which is less than 500 nm, more preferably, less than 250 nm, 100 nm, 50 nm or 25 nm.

The nanostructures can be of any shape or geometry. In certain embodiments, the nanostructures are isotropically shaped (i.e., aspect ratio=1). Typical isotropic nanostructures include nanoparticles. In preferred embodiments, the nanostructures are anisotropically shaped (i.e., aspect ratio≠1). As used herein, "aspect ratio" refers to the ratio between the length and the width (or diameter) of the nanostructure. The anisotropic nanostructure typically has a longitudinal axis along its length. Exemplary anisotropic nanostructures include nanowires and nanotubes, as defined herein.

The nanostructures can be solid or hollow. Solid nanostructures include, for example, nanoparticles and nanowires. "Nanowires" thus refers to solid anisotropic nanostructures. Typically, each nanowire has an aspect ratio (length:diameter) of greater than 10, preferably greater than 50, and more preferably greater than 100. Typically, the nanowires are more than 500 nm, more than 1 µm, or more than 10 µm long.

Hollow nanostructures include, for example, nanotubes. Typically, the nanotube has an aspect ratio (length:diameter) of greater than 10, preferably greater than 50, and more preferably greater than 100. Typically, the nanotubes are more than 500 nm, more than 1 µm, or more than 10 µm in length.

The nanostructures can be formed of any electrically conductive material. Most typically, the conductive material is metallic. The metallic material can be an elemental metal (e.g., transition metals) or a metal compound (e.g., metal oxide). The metallic material can also be a bimetallic material or a metal alloy, which comprises two or more types of metal. Suitable metals include, but are not limited to, silver, gold, copper, nickel, gold-plated silver, platinum and palladium. The conductive material can also be non-metallic, such as carbon or graphite (an allotrope of carbon).

Nanostructure Layer

In general, a nanostructure layer or coating acts as a transparent electrode in the opto-electrical devices described herein. The nanostructure layer (also referred to as a transparent conductor layer) is formed by depositing a liquid dispersion (or coating composition) comprising a liquid carrier and a plurality of conductive nanostructures, and allowing the liquid carrier to dry. The nanostructure layer may also be first formed on a transfer film, then transferred to an underlying layer in the opto-electrical device.

The nanostructure layer comprises nanostructures that are randomly distributed and interconnect with one another. As the number of the nanostructures reaches the percolation threshold, the thin film is electrically conductive. Other non-volatile components of the ink composition, including, for example, one or more binders, surfactants and viscosity modifiers, may form part of the conductive film. Thus, unless specified otherwise, as used herein, "conductive film" refers to a nanostructure layer formed of networking and percolative nanostructures combined with any of the non-volatile components of the ink composition, and may include, for example, one or more of the following: a binder (e.g., a viscosity modifier), surfactant and corrosion inhibitor.

The liquid carrier for the dispersion may be water, an alcohol, a ketone or a combination thereof. Exemplary alcohols may include isopropanol (IPA), ethanol, diacetone alcohol (DAA) or a combination of IPA and DAA. Exemplary ketones may include methyl ethyl ketone (MEK) and methyl propyl ketone (MPK).

The surfactants serve to reduce aggregation of the nanostructures and/or the light-scattering material. Representative examples of suitable surfactants include fluorosurfactants such as ZONYL® surfactants, including ZONYL® FSN, ZONYL® FSO, ZONYL® FSA, ZONYL® FSH (DuPont Chemicals, Wilmington, Del.), and NOVEC™ (3M, St. Paul, Minn.). Other exemplary surfactants include non-ionic surfactants based on alkylphenol ethoxylates. Preferred surfactants include, for example, octylphenol ethoxylates such as TRITON™ (x100, x114, x45), and nonylphenol ethoxylates such as TERGITOL™ (Dow Chemical Company, Midland Mich.). Further exemplary non-ionic surfactants include acetylenic-based surfactants such as DYNOL® (604, 607) (Air Products and Chemicals, Inc., Allentown, Pa.) and n-dodecyl β-D-maltoside.

The viscosity modifier serves as a binder that immobilizes the nanostructures on a substrate. Examples of suitable viscosity modifiers include hydroxypropyl methylcellulose (HPMC), methyl cellulose, xanthan gum, polyvinyl alcohol, carboxy methyl cellulose, and hydroxy ethyl cellulose.

In particular embodiments, the weight ratio of the surfactant to the viscosity modifier in the coating solution is preferably in the range of about 80:1 to about 0.01:1; the weight ratio of the viscosity modifier to the conductive nanostructures is preferably in the range of about 5:1 to about 0.000625:1; and the weight ratio of the conductive nanostructures to the surfactant is preferably in the range of about 560:1 to about 5:1. The ratios of components of the coating solution may be modified depending on the substrate and the method of application used. A preferred viscosity range for the coating solution is between about 1 and 100 cP.

In one embodiment, the coating solution may initially contain a binder (e.g., HPMC) to facilitate film forming. However, the binder should be removed thereafter such that the nanostructures form a discontinuous layer and do not interfere with the optical interaction between the anti-reflective layer and the organic stack.

The electrical conductivity of the conductive film is often measured by "sheet resistance," which is represented by Ohms/square (or "ohms/sq"). The sheet resistance is a function of at least the surface loading density, the size/shapes of the nanostructures, and the intrinsic electrical property of the nanostructure constituents. As used herein, a thin film is considered conductive if it has a sheet resistance of no higher than $10^8$ ohms/sq. Preferably, the sheet resistance is no higher than $10^4$ ohms/sq, 3,000 ohms/sq, 1,000 ohms/sq or 350 ohms/sq, or 100 ohms/sq. Typically, the sheet resistance of a conductive network formed by metal nanostructures is in the ranges of from 10 ohms/sq to 1000 ohms/sq, from 100 ohms/sq to 750 ohms/sq, 50 ohms/sq to 200 ohms/sq, from 100 ohms/sq to 500 ohms/sq, or from 100 ohms/sq to 250 ohms/sq, or 10 ohms/sq to 200 ohms/sq, from 10 ohms/sq to 50 ohms/sq, or from 1 ohms/sq to 10 ohms/sq. For the opto-electrical devices described herein, the sheet resistance is typically less than 20 ohms/square, or less than 15 ohms/square, or less than 10 ohms/square.

Optically, the nanostructure-based transparent conductors have high light transmission in the visible region (400 nm-700 nm). Typically, the transparent conductor is considered optically clear when the light transmission is more than 70%, or more typically more than 85% in the visible region. More preferably, the light transmission is more than 90%, more than 93%, or more than 95%. As used herein, unless specified otherwise, a conductive film is optically transparent (e.g., more than 70% in transmission). Thus, transparent conductor, transparent conductive film, layer or coating, conductive film, layer or coating, and transparent electrode are used interchangeably.

Haze is an index of optical clarity. Haze results from light-scattering and reflection/refraction due to both bulk and surface roughness effects. For certain opto-electrical devices such as PV cells and OLED lighting applications, high-haze transparent conductors may be preferred. These transparent conductors typically have haze values of more than 10%, more typically more than 15%, or more typically, in the range of 20%-50%. See Published U.S. Patent Application No. 2011/0163403. For other devices such as OLED for display applications, low-haze is preferred. Additional details for adjusting or reducing haze can be found, for example, Published U.S. Patent Application No. 2009/0321113. These published U.S. patent applications are co-pending applications assigned to Cambrios Technologies Inc., the assignee of the present disclosure.

Unless otherwise specified, the haze value of a give transparent conductor described and claimed herein is measured photo-optically in accordance with ASTM D 1003-07, "Standard Test Method for Haze and Luminous Transmittance of Transparent Plastics."

Matrix

"Matrix" refers to a solid-state material into which the metal nanowires are dispersed or embedded. Portions of the nanowires may protrude from the matrix to enable surface access to the conductive network. The matrix is a host for the metal nanowires and provides a physical form of the conductive layer. The matrix protects the metal nanowires from adverse environmental factors, such as corrosion and abrasion. In particular, the matrix significantly lowers the permeability of corrosive elements in the environment, such as moisture, trace amount of acids, oxygen, sulfur and the like.

In addition, the matrix offers favorable physical and mechanical properties to the conductive layer. For example, it can provide adhesion to the substrate. Furthermore, unlike the fragile metal oxide films, polymeric or organic matrices embedded with metal nanowires can be robust and flexible. As will be discussed in more detail herein, flexible matrices make it possible to fabricate transparent conductors in a low-cost, high throughput process.

Moreover, the optical properties of the conductive layer can be tailored by selecting an appropriate matrix material. For example, reflection loss and unwanted glare can be effectively reduced by using a matrix of a desirable refractive index, composition and thickness.

Typically, the matrix is an optically clear material. A material is considered optically clear if the light transmission of the material is at least 80% in the visible region (400 nm-700 nm). Unless specified otherwise, all the layers (including the substrate) in a transparent conductor described herein are preferably optically clear. The optical clarity of the matrix is typically determined by a multitude of factors, including without limitation: the refractive index (RI), thickness, consistency of RI throughout the thickness, surface (including interface) reflection, and haze (a scattering loss caused by surface roughness and/or embedded particles).

In certain embodiments, the matrix is a binder, i.e., the matrix is initially dispersed in the ink composition with the nanostructures. In these embodiments, the terms "matrix" and "binder" are interchangeable. Following deposition on a substrate, the matrix cures as the volatile components of the ink composition are removed or evaporate.

In other embodiments, the matrix is formed after the ink composition is deposited on a substrate. In this regard, in addition to providing a medium for suspending the nanostructures, the matrix may also form a protective layer or overcoat overlying the nanostructures. U.S. Pat. No. 8,049,333, which is incorporated herein by reference in its entirety, provides detailed description of forming matrix.

In certain embodiments, the matrix is about 10 nm to 5 μm thick, about 20 nm to 1 μm thick, or about 50 nm to 200 nm thick. In other embodiments, the matrix has a refractive index of about 1.3 to 2.5, or about 1.35 to 1.8.

In certain embodiments, the matrix is a polymer, which is also referred to as a polymeric matrix. Optically clear polymers are known in the art. Preferably, the polymer is crosslinkable or reflowable (e.g., flowable after curing upon heating). Examples of suitable polymeric matrices include, but are not limited to: polyacrylics such as polymethacrylates (preferably, poly(methyl methacrylate)), polyacrylates and polyacrylonitriles, polyvinyl alcohols, polyesters (e.g., polyethylene terephthalate (PET), polyester naphthalate, and polycarbonates), polymers with a high degree of aromaticity such as phenolics or cresol-formaldehyde (Novolacs®), polystyrenes, polyvinyltoluene, polyvinylxylene, polyimides, polyamides, polyamideimides, polyetherimides, polysulfides, polysulfones, polyphenylenes, and polyphenyl ethers, polyurethane (PU), epoxy, polyolefins (e.g. polypropylene, polymethylpentene, and cyclic olefins), acrylonitrile-butadiene-styrene copolymer (ABS), cellulosics, silicones and other silicon-containing polymers (e.g. polysilsesquioxanes and polysilanes), polyvinylchloride (PVC), polyacetates, polynorbornenes, synthetic rubbers (e.g. EPR, SBR, EPDM), and fluoropolymers (e.g., polyvinylidene fluoride, polytetrafluoroethylene (TFE) or polyhexafluoropropylene), copolymers of fluoro-olefin and hydrocarbon olefin (e.g., Lumiflon®), and amorphous fluorocarbon polymers or copolymers (e.g., CYTOP® by Asahi Glass Co., or Teflon® AF by Du Pont).

In other embodiments, the matrix is an inorganic material. For example, a sol-gel matrix based on silica, mullite, alumina, SiC, $MgO-Al_2O_3-SiO_2$, $Al_2O_3-SiO_2$, $MgO-Al_2O_3-SiO_2-Li_2O$ or a mixture thereof can be used.

In certain embodiments, the matrix itself is conductive. For example, the matrix can be a conductive polymer. Conductive polymers are well known in the art, including without limitation: poly(3,4-ethylenedioxythiophene) (PEDOT), polyanilines, polythiophenes, and polydiacetylenes.

Anti-Reflective Layer

An anti-reflective layer can take the form of a Rayleigh's film based on the principle of index matching, or an interference film based on destructive interference.

Rayleigh's film is a thin film interposed between two layers that have different indices of refraction, e.g., a substrate and an organic layer (of an OLED). The index of refraction of the anti-reflective layer is a value selected between those of the substrate and the organic layer (i.e., "index matching"). The presence of the anti-reflective layer mitigates the large difference of the indices of refraction of the substrate and the organic layer, thus reducing the internal reflection at their respective interfaces.

In various embodiments, the anti-reflective layer may have an index of refraction in the range of 1.5-1.8, or in the range of 1.55-1.6, or in the range of 1.6-1.65, or in the ranges of 1.65-1.7, or 1.7-1.75, or 1.75-1.8.

The anti-reflective layer is typically optically transparent and has a thickness between 200 nm to 2 microns.

In a preferred embodiment, the anti-reflective layer is a polyimide layer. Typically, polyimides (regardless of the specific chemical moieties thereof) have indices of refraction of about 1.6, which value is between those of a typical substrate (e.g., glass) and the organic stack, which tends to have a much higher index of refraction than that of the substrate.

The anti-reflective layer can be typically deposited on a substrate according to known methods in the art, which includes spin-coating, slot die coating or gravure coating, etc.

As an alternative to an index matching Rayleigh's film, a multi-layer interference film may also be used. Such an interference film typically comprises alternating layers of low refractive index material and high refractive index material, the thickness of which can be selected and optimized depending on the wavelength to be transmitted.

Light-Emitting Layer

The light-emitting layer is a component of the organic stack in the OLED, according to one embodiment. The light-emitting layer can be an organic material capable of emitting light when a current is passed between the anode (30) and the cathode. Preferably, the light-emitting layer contains a phosphorescent emissive material, although fluorescent emissive materials may also be used. Phosphorescent materials are preferred because of the higher luminescent efficiencies associated with such materials. The light-emitting layer may also comprise a host material capable of transporting electrons and/or holes, doped with an emissive material that may trap electrons, holes, and/or excitons, such that excitons relax from the emissive material via a photoemissive mechanism. The light-emitting layer may comprise a single material or a material that combines transport and emissive properties.

Photo-Active Layer

The photo-active layer is also a type of organic stack, which is the light-absorbing component of a PV cell that converts light directly into electricity.

The photo-active layer may be one or more of the following semiconductive materials: monocrystalline silicon, polycrystalline silicon, amorphous silicon, cadmium telluride, and copper indium selenide/sulfide. Other suitable materials include thin-film layers of organic dyes, and/or organic polymers. Alternatively, nanocrystals or quantum dots (electron-confined nanoparticles) may be used as the light-absorbing material.

The photo-active layer can be a single layer, or more typically, in multiple physical configurations to take advantage of different light absorption and charge separation mechanisms.

Scattering Centers

As used herein, scattering centers are formed by light-scattering material, which is an inert material that causes light scattering. The light-scattering material includes, for example, particulate scattering media or scattering-promoting agents (e.g., precursors).

In certain embodiments, the light-scattering material is in the form of particles, also referred to as "light-scattering particles," which can be directly incorporated into a coating solution of polyimide. Following coating of the polyimide solution on the substrate, the light-scattering particles are distributed randomly in the polyimide film.

The light-scattering particles are preferably micro-sized particles, or more preferably nano-sized particles. Typically, the particle sizes are in the range of 1 nm to several microns; preferably in the range of 10 nm-800 nm, 10 nm-600 nm, 10 nm-400 nm, or 10 nm-200 nm. More typically, the particle sizes are in the range of 1 nm-100 nm.

The light-scattering particles may be an inorganic material, which may be conductive, semiconductive, or non-conductive. Typically, the index of refraction of the light scattering material should be high (e.g., more than 1.6, or more typically, more than 1.7, or more typically, about 1.8). Examples of suitable light-scattering particles include, without limitation, $SiO_x$, $AlO_x$, $InO_x$, $SnO_x$, $ZnO_x$, Al-doped $ZnO_x$ (AZO), indium tin oxide (ITO), Sb-doped $SnO_x$ (ATO), $TiO_x$, SiC, fluorine-doped $SnO_x$ (FTO), and the like. Examples of higher refractive index particles include $TiO_x$, $AlO_x$, and $ZnO_x$. Examples of conductive particles include ITO, AZO, ATO, and the like. Different oxidation ratios (stoichiometries and hence doping levels) may be used, particularly with respect to systems that include three or more elements (e.g., AZO, ATO, ITO). In particular and in preferred embodiments, such materials, compositions and doping levels may be used for the scattering additives and also act as a suitable buffer and interface layer between the conductive nanostructure network and an adjacent semiconductor (e.g., a-Si, um-Si layer in a PV stack). For example, without limitation, AdNano® ZnO 20 and AdNano® Z805 nanoparticles and AdNano® ZnO deionized water-based dispersion can be used in this way.

Additional description of the light-scattering materials can be found in Published U.S. Patent Application No. 2011/0163403, which is incorporated herein by reference in its entirety.

Substrate

Any substrate suitable for conventional OLED is also suitable for the various embodiments of the present disclosure. Examples of rigid substrates include glass, polycarbonates, acrylics, and the like.

Examples of flexible substrates include, but are not limited to: polyesters (e.g., polyethylene terephthalate (PET), polyester naphthalate, and polycarbonate), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, and cellulose acetate), polysulphones such as polyethersulphone, polyimides, silicones, and other conventional polymeric films.

EXAMPLES

Example 1

Synthesis of Silver Nanowires

Silver nanowires were synthesized by the reduction of silver nitrate dissolved in ethylene glycol in the presence of poly(vinyl pyrrolidone) (PVP) following the "polyol" method described in, e.g., Y. Sun, B. Gates, B. Mayers, & Y. Xia, "Crystalline silver nanowires by soft solution processing," *Nanoletters* 2(2): 165-168, 2002. A modified polyol method, described in co-pending and co-owned U.S. patent application Ser. No. 11/766,552, produces more uniform silver nanowires at higher yields than does the conventional "polyol" method. This application is incorporated by reference herein in its entirety. Resulting nanowires primarily had lengths from about 13 μm to about 17 μm and diameters from about 34 nm to about 44 nm.

Example 2

Standard Preparation of Coating Composition of Conductive Nanostructures

A typical coating composition for depositing metal nanowires comprises, by weight, from 0.0025% to 0.1% surfactant (e.g., a preferred range is from 0.0025% to 0.05% for ZONYL® FSO-100), from 0.02% to 4% viscosity modifier (e.g., a preferred range is 0.02% to 0.5% for hydroxypropyl methylcellulose (HPMC), from 94.5% to 99.0% solvent and from 0.05% to 1.4% metal nanowires.

The coating composition can be prepared based on a desired concentration of the nanowires, which is an index of the loading density of the final conductive film formed on the substrate.

The coating composition can be deposited on a substrate according to, for example, the methods described in co-pending U.S. patent application Ser. No. 11/504,822.

As understood by one skilled in the art, other deposition techniques can be employed, e.g., sedimentation flow metered by a narrow channel, die flow, flow on an incline, slit coating, gravure coating, microgravure coating, bead coating, dip coating, slot die coating, and the like. Printing techniques can also be used to directly print an ink composition onto a substrate with or without a pattern. For example, inkjet, flexoprinting and screen printing can be employed. It is further understood that the viscosity and shear behavior of the fluid as well as the interactions between the nanowires may affect the distribution and interconnectivity of the nanowires deposited.

A sample conductive nanostructure dispersion was prepared that comprised silver nanowires as fabricated in Example 1 dispersed, a surfactant (e.g., Triton), and a viscosity modifier (e.g., low molecular-weight HPMC) and water. The final dispersion included about 0.4% silver and 0.4% HPMC (by weight). This dispersion can be used (neat or diluted) in combination with a light-scattering material (e.g., in a particulate form) directly to form a coating solution. Alternatively, the dispersion can be combined with a dispersion of a light-scattering material to form a coating solution.

Example 3

A polyimide coating solution (e.g., SUNEVER Polyimide (type 0821)) was first deposited on a substrate, spun on at 1500 rpm, followed by drying at 90° C., and curing for 30 min at 200° C. The haze and transmission of the resulting sample were 0.1% and 92.1%, respectively. The film thickness was measured at 1.2 microns.

Example 4

Silver nanowires were deposited on an anti-reflective layer, e.g., a polyimide film, to form a conductive film. A standard nanowire suspension was first prepared according to Example 2 (0.4% AgNW, 0.4% LMw HPMC, 250 ppm Triton X). The coating solution was spun on the polyimide film at 1000 rpm, followed by drying for 90 seconds at 50° C. and annealing for 90 seconds at 140° C. The resulting sheet resistance is 9 ohms/sq with 87.5% in transmission and 3.9% in haze.

Compared to a device without the polyimide layer, i.e., the nanowires were deposited directly on glass, the optical data as well as the sheet resistance were substantially identical. The anti-reflective layer does not impact the optical and electrical performance of the nanostructure layer.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An optical stack comprising:
a first electrode;
an organic stack underlying the first electrode;
a nanostructure layer underlying the organic stack, the nanostructure layer comprises a plurality of metal nanostructures;
a high-index layer underlying the nanostructure layer; and
a substrate underlying the high-index layer, wherein the high-index layer has the same or a higher refractive index than the organic stack, and wherein the nanostructure layer forms a second electrode, and comprises a high-index matrix, wherein the high-index matrix has the same or a higher refractive index than the organic stack.

2. The optical stack of claim 1 wherein, when waveguided light within the optical stack is represented by an energy density distribution curve, the nanostructure layer is positioned such that it overlaps with at least 10% of the energy density distribution curve.

3. An optical stack comprising:
a first electrode;
an organic stack underlying the first electrode;
a nanostructure layer underlying the organic stack, the nanostructure layer comprises a plurality of metal nanostructures;
a high-index layer underlying the nanostructure layer; and
a substrate underlying the high-index layer, wherein the high-index layer has the same or a higher refractive index than the organic stack, and wherein the nanostructure layer forms a second electrode, and comprises a low-index matrix, wherein the low-index matrix has a lower refractive index than the organic stack.

4. A top-emitting OLED comprising:
a substrate;
a first electrode disposed on the substrate;
an organic stack disposed on the first electrode; and
a nanostructure layer including a plurality of nanostructures overlying the organic stack, wherein the nanostructure layer is a second electrode, and wherein the nanostructure layer further comprises a matrix, in which the plurality of nanostructures are embedded.

5. An OLED comprising:
a substrate;
a bottom electrode disposed on the substrate;
an organic stack disposed on the bottom electrode; and
a metal film disposed on the organic stack, wherein the metal film has an outer surface and contacts the organic stack by a metal/organic interface, and wherein a first plurality of nanostructures are disposed on the metal/organic interface, and a second plurality of nanostructures are disposed on the outer surface.

6. The OLED of claim 5 wherein the second plurality of nanostructures are embedded in a matrix disposed on the outer surface.

7. An OLED comprising:
a transparent substrate;
a transparent bottom electrode disposed on the transparent substrate;
an organic stack disposed on the transparent bottom electrode; and a metal film disposed on the organic stack, wherein the metal film contacts the organic stack by a metal/organic interface and has an outer surface, and wherein a plurality of nanostructures are disposed on the outer surface, the plurality of nanostructures being embedded in a matrix.

8. An organic light-emitting diode (OLED) comprising:
a substrate having a top surface and a bottom surface, the top surface being an interface between the substrate and air;
an anti-reflective layer contacting the bottom surface of the substrate;
a first electrode deposited on the anti-reflective layer, the first electrode comprising a plurality of conductive nanostructures;
an organic stack deposited on the first electrode, the organic stack comprising an organic light-emitting material, a charge injection layer and a hole injection layer; and
a second electrode deposited on the organic stack.

9. The OLED of claim 8 wherein the substrate has a first refractive index, and the organic stack has a second refractive index, and the anti-reflective layer has a third refractive index, and wherein the third refractive index is larger than the first refractive index and less than the second refractive index.

10. The OLED of claim 8 wherein the anti-reflective layer has an index of reflection in the range of 1.5-1.8.

11. The OLED of claim 8 wherein the anti-reflective layer is a polyimide layer.

12. The OLED of claim 8 wherein the first electrode is an anode and the second electrode is a cathode.

13. The OLED of claim 8 wherein the substrate is glass.

14. The OLED of claim 8 wherein the anti-reflective layer further comprises a plurality of light-scattering particles.

15. The OLED of claim 14 wherein the light-scattering particles are $SiO_x$, $AlO_x$, $InO_x$, $SnO_x$, $ZnO_x$, Al-doped $ZnO_x$ (AZO), indium tin oxide (ITO), Sb-doped $SnO_x$ (ATO), $TiO_x$, SiC, or fluorine-doped $SnO_x$ (FTO).

16. An organic light-emitting diode (OLED) comprising:
a first electrode;
an organic stack underlying the first electrode, the organic stack comprising an organic light-emitting material, a charge injection layer, and a hole injection layer;
a second electrode underlying the organic stack having a plurality of interconnecting conductive nanostructures, wherein the second electrode further comprises an insulating binder in which the conductive nanostructures are embedded, and wherein the insulating binder has a third refractive index;
a first high-index layer underlying the second electrode; and
a substrate underlying the high-index layer,
wherein light generated in the organic stack exits from the substrate; and wherein the organic stack has a first refractive index, and the high-index layer has a second refractive index, and wherein the second refractive index is the same or higher than the first refractive index.

17. The OLED of claim 16 wherein the second refractive index is higher than the third refractive index.

18. The OLED of claim 16 wherein the second refractive index is the same as the third refractive index, and wherein the binder and the high-index layer are of a same material.

19. The OLED of claim 18 further comprising a second high-index layer underlying the first high-index layer.

20. The OLED of claim 19 wherein the first high-index layer and the second high-index layer further include a plurality of light scattering particles.

21. The OLED of claim 19 wherein the first high-index layer and the second high-index layer are polyimide.

22. An optical stack comprising:
a first electrode;
an organic stack underlying the first electrode;
a nanostructure layer underlying the organic stack, the nanostructure layer comprises a plurality of metal nanostructures;
a high-index layer underlying the nanostructure layer; and
a substrate underlying the high-index layer, wherein the high-index layer has the same or a higher refractive index than the organic stack, and wherein the nanostructure layer forms a second electrode,
wherein, when waveguided light within the optical stack is represented by an energy density distribution curve, the nanostructure layer is positioned such that it overlaps with at least 10% of the energy density distribution curve.

23. The optical stack of claim 22 wherein the nanostructure layer comprises a low-index matrix, wherein the low-index matrix has a lower refractive index than the organic stack.

* * * * *